April 13, 1965 L. I. MAISSEL ETAL 3,178,271
HIGH TEMPERATURE OHMIC JOINT FOR SILICON
SEMICONDUCTOR DEVICES AND METHOD
OF FORMING SAME
Filed Feb. 26, 1960

INVENTORS
LEON I. MAISSEL
HARRY CASSEL
BY
Fordyce A. Bothwell
ATTORNEY

United States Patent Office 3,178,271

Patented Apr. 13, 1965

3,178,271

HIGH TEMPERATURE OHMIC JOINT FOR SILICON SEMICONDUCTOR DEVICES AND METHOD OF FORMING SAME

Leon I. Maissel, North Wales, and Harry A. Cassel, Philadelphia, Pa., assignors, by mesne assignments, to Philco Corporation, Philadelphia, Pa., a corporation of Delaware Filed Feb. 26, 1960, Ser. No. 11,202
4 Claims. (Cl. 29—195)

Figure 1:
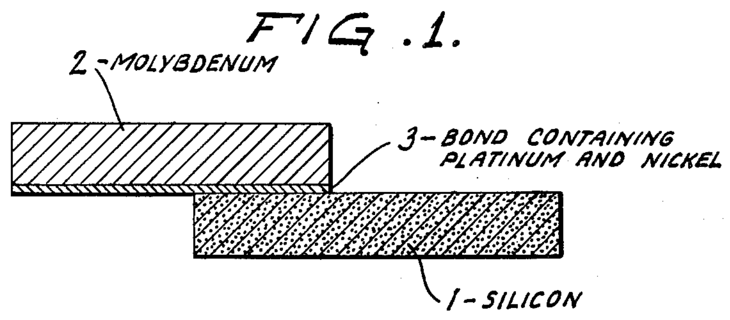

This invention relates to silicon semiconductor devices and more particularly to the formation of a high temperature ohmic joint in such a device between the silicon body and a metal element.

In silicon transistors, for example, it is necessary to provide an ohmic joint between the silicon body and a base tab which may be composed of a metal, such as molybdenum, which has a coefficient of thermal expansion fairly close to that of silicon. In the past, the joint between the silicon body and the base tab has been formed by the use of a solder, such as a gold alloy solder, capable of withstanding temperatures of the order of several hundred degrees centigrade. However, with advancement of the art there has arisen a need for a joint between silicon and a base tab capable of withstanding much higher temperatures both during and after fabrication of a semiconductor device. For example, during fabrication of a silicon transistor it may be desired to use the base tab, after its jointure to the silicon body, as a holder or support means during subsequent fabrication steps some of which may involve subjection of the device to very high temperatures. The use of the base tab as a holder is particularly desirable in view of the fact that the silicon body is in the form of a very thin fragile blank or wafer, and without the base tab it is necessary to provide some kind of special holder. However, solder joints in the past have been incapable of withstanding the very high temperatures involved in some fabrication steps.

The principal object of the present invention is to provide a strong ohmic joint between a silicon body and a metal element which is capable of withstanding very high temperatures, e.g., temperatures up to 850–900° C.

We have discovered that the needed strong and high temperature-resistant joint between silicon and (for example) molybdenum can be formed by employing platinum and nickel as the bonding agents. We have found that platinum is capable of providing such a joint because it and silicon have an eutectic reaction, it has high ductility, and its coefficient of thermal expansion is close to that of silicon. In accordance with this invention, therefore, platinum is introduced as a solder layer between the silicon wafer and the base tab.

We have also found that the use of nickel in the joint serves two purposes. The nickel greatly improves the joint, making it substantially strain-free, and it can also serve as a carrier for donor or acceptor impurities to enhance the joint electrically. Thus if it is desired to join a molybdenum element to P-type silicon, a layer composed of nickel and a small amount of boron may be provided. If it is desired to join a molybdenum element to N-type silicon, a layer composed of nickel and a small amount of phosphorus may be provided. In either case, the nickel serves both as a strain-relieving agent and as a carrier for the donor or acceptor impurity which improves the ohmic character of the joint.

The bond is effected by application of heat at about 1000° C. for 10 to 15 seconds. Although all of the materials involved have melting points well above that temperature, platinum and silicon have a eutectic reaction at a temperature of 830° C. which effects a strong bond.

It is not definitely known why the nickel greatly improves the joint and makes it substantially strain-free. However, it is postulated that the nickel hinders or prevents the formation of intermetallic compounds between platinum and silicon.

Figure 2:
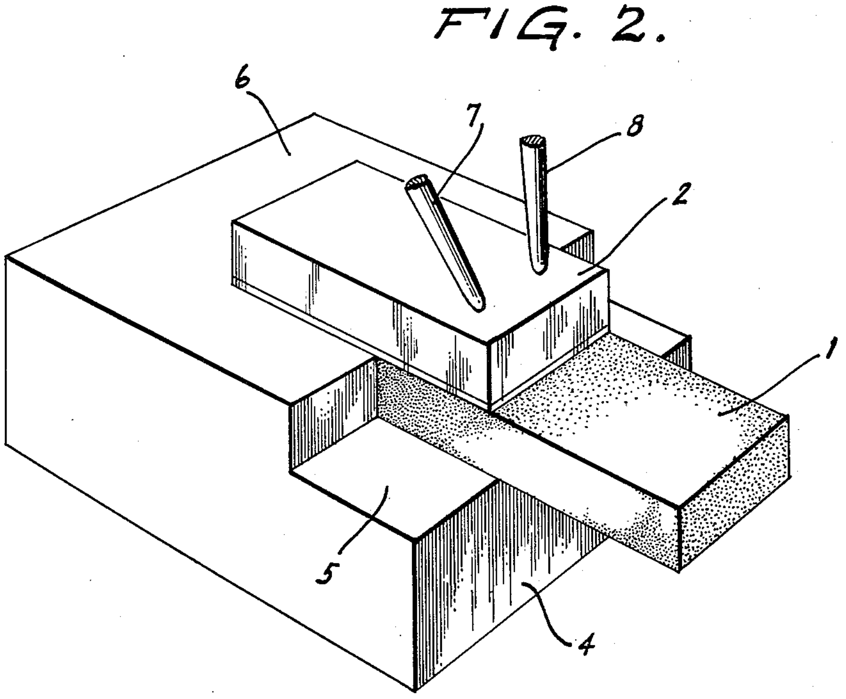

The invention may be fully understood from the following detailed description with reference to the accompanying drawing wherein FIG. 1 is a sectional view of a joint according to this invention, with the thickness of the elements greatly exaggerated; and FIG. 2 is an isometric view showing how the heating step may be carried out.

Referring first to FIG. 1, the silicon blank or wafer is shown at 1, the base tab (e.g., molybdenum) is shown at 2, and the bond is shown at 3. As indicated, the bond contains platinum and nickel.

While the invention contemplates that the aforementioned platinum and nickel layers may be provided in any suitable manner, preferably this is done by electroplating on the surface of the base tab to be joined to the silicon body. The thickness of the electroplated layers depends on the thickness of the silicon body and the base tab. For a silicon blank or wafer 3 to 5 mils thick and a base tab 5 mils thick, optimum layer thicknesses are 0.2 mil for the platinum and 0.1 mil for the nickel. For thicker silicon blanks and base tabs, thicker layers may be used although this is not necessary.

For electroplating the layers on the base tab, conventional plating baths may be used. By way of example, the following plating baths may be used.

The platinum plating bath may be that known by the trade name Platinex III which is a commercial product of Sel-rex Corporation.

A suitable nickel-boron plating bath for use with P-type silicon is as follows:

| | Grams/liter |
|---|---|
| $NiSO_4.6H_2O$ | 300 |
| $NiCl_2.6H_2O$ | 60 |
| Boric acid | 38 |

A suitable nickel-phosphorus plating bath for use with N-type silicon is as follows:

| | Grams/liter |
|---|---|
| $NiSO_4.6H_2O$ | 175 |
| $NiCl_2.6H_2O$ | 50 |
| $H_3PO_4$ | 50 |
| $H_3PO_3$ | 1.3 |

In experimental practice of this invention, there were added to the last solution above 14 grams of $NiCO_3$ neutralized with approximately 50 grams of phosphoric acid.

In preparation for the formation of the joint, the base tab and the silicon blank may be cleaned in any suitable manner. For example, in experimental practice molybdenum base tabs were cleaned by anodizing in concentrated sulphuric acid. Silicon blanks were dipped in hydrofluoric acid, rinsed in deionized water, and dried in a jet of air just prior to joint-forming operation.

In the formation of a high temperature ohmic joint according to this invention, the preferred procedure is as follows. To ensure good bonding of the platinum to the base tab, two strike coats are first applied. The base tab is first electroplated with a very thin layer of chromium about one-millionth of an inch thick. Then a similar very thin layer of nickel is electroplated onto the chromium layer. Then the platinum layer is electroplated onto the thin nickel layer. Finally, the nickel-boron or nickel-phosphorus layer is electroplated onto the platinum layer. Then the plated base tab and the silicon blank are held in contact with each other and heated as above described to form the joint.

FIG. 2 shows how the heating operation was performed in experimental practice. The silicon blank 1 and the plated base tab 2 were placed in overlapping engagement on a refractory support 4 having surfaces 5 and 6 at different levels to support the silicon blank and the plated base tab, the plated layers being in engagement with the silicon blank. Two tungsten rods or probes 7 and 8 were used to press the plated tab against the silicon wafer and to pass current between the probes through the base tab. In this procedure, the pressure must be applied uniformly at the two probes, as otherwise the platinum-nickel solder will wet only in the area of highest pressure and may even go through the silicon blank.

Experimental practice has indicated that carbon is the only suitable material for the refractory support or block used in the above-described procedure. Since pure carbon is too fragile, a block of alumina having its surface coated with graphite was used.

For reproducible results, the heating operation may be carried out in a non-reactive atmosphere such as argon.

It will be understood from the foregoing description that the essence of this invention is the formation of a joint between a silicon body and a metal element by the interposition of platinum and nickel as the bonding agents and by applying heat to effect the bond. It will also be understood that in the preferred embodiment the invention contemplates the employment of impurity-carrying nickel to enhance the joint electrically.

While a preferred embodiment has been described, the invention is not limited thereto but contemplates such modifications and further embodiments as may occur to those skilled in the art. For example, instead of electroplating platinum and nickel onto the base tab, cladding or thermal evaporation may be employed. The base tab itself, while preferably composed of molybdenum, might be composed of tantalum, tungsten or niobium. The use of strike coats might also be modified, or in some instance even eliminated.

We claim:

1. A composite layer in a semiconductor device comprising a silicon body secured to a base member composed of a metal selected from the group consisting of molybdenum, tantalum, tungsten and niobium, and a bond securing said base member to said silicon body consisting of a platinum layer metallurgically bonded to said base member and a nickel layer metallurgically bonded to the platinum layer and secured to the silicon layer, the said nickel layer having with the silicon layer a bonding zone wherein the material consists of elements from the interaction of the nickel layer, silicon layer and impurities contained in the silicon layer caused in the bonding step.

2. A device according to claim 1, wherein said base member is composed of molybdenum.

3. A device according to claim 1, wherein said material comprises a product of eutectic reaction between platinum of said bond and silicon of said body.

4. A device according to claim 1, wherein said base member is composed of molybdenum and said material comprises a product of eutectic reaction between platinum of said bond and silicon of said body.

References Cited by the Examiner

UNITED STATES PATENTS

| | | | |
|---|---|---|---|
| 2,139,431 | 12/38 | Vatter | 29—472.7 |
| 2,335,376 | 11/43 | Ballintine | 29—472.7 |
| 2,799,081 | 9/52 | Farnham | 29—195 |
| 2,811,682 | 10/57 | Pearson | 317—240 |
| 2,854,612 | 9/58 | Zaratkiewicz | 317—240 |
| 2,888,742 | 6/59 | Stumback | 29—195 |
| 2,922,092 | 1/60 | Gazzara | 29—194 |
| 2,935,453 | 5/60 | Saubestre | 317—240 |
| 2,962,394 | 11/60 | Andres | 117—217 X |
| 2,973,466 | 2/61 | Attala | 317—240 |
| 3,042,550 | 7/62 | Allen | 29—473.1 X |

BENJAMIN HENKIN, *Primary Examiner.*

WHITMORE A. WILTZ, HYLAND BIZOT, DAVID L. RECK, *Examiners.*